(12) United States Patent
Goda et al.

(10) Patent No.: US 9,786,375 B2
(45) Date of Patent: Oct. 10, 2017

(54) MULTIPLE BLOCKS PER STRING IN 3D NAND MEMORY

(71) Applicant: Intel Corporation, Santa Clara, CA (US)

(72) Inventors: Akira Goda, Boise, ID (US); Graham Richard Wolstenholme, Boise, ID (US); Tomoharu Tanaka, Kanagawa (JP)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/852,429

(22) Filed: Sep. 11, 2015

(65) Prior Publication Data

US 2017/0076805 A1     Mar. 16, 2017

(51) Int. Cl.
| | | |
|---|---|---|
| *G11C 11/34* | (2006.01) | |
| *G11C 16/16* | (2006.01) | |
| *G11C 16/04* | (2006.01) | |
| *G11C 16/26* | (2006.01) | |
| *G11C 16/34* | (2006.01) | |

(52) U.S. Cl.
CPC .......... *G11C 16/16* (2013.01); *G11C 16/0483* (2013.01); *G11C 16/26* (2013.01); *G11C 16/3495* (2013.01)

(58) Field of Classification Search
CPC ............................ G11C 16/16; G11C 16/0483
USPC .................................................. 365/185.17
See application file for complete search history.

(56) References Cited

U.S. PATENT DOCUMENTS

| | | | |
|---|---|---|---|
| 6,295,227 B1 | 9/2001 | Sakui et al. | |
| 8,913,431 B1 * | 12/2014 | Costa ................. | G11C 16/0408 |
| | | | 365/185.05 |
| 9,036,428 B1 | 5/2015 | D'Abreu | |
| 2006/0256623 A1 | 11/2006 | Roohparvar | |
| 2007/0263457 A1 | 11/2007 | Park | |
| 2011/0199827 A1 | 8/2011 | Puzzilli et al. | |

(Continued)

OTHER PUBLICATIONS

International Search Report and Written Opinion mailed Nov. 14, 2016, issued in corresponding International Application No. PCT/US2016/045766, 14 pages.

*Primary Examiner* — Anthan Tran
(74) *Attorney, Agent, or Firm* — Schwabe, Williamson & Wyatt, P.C

(57) ABSTRACT

Embodiments describe techniques and configurations for an apparatus including a three-dimensional (3D) memory array having a plurality of strings of memory cells, where individual strings may have memory cells that correspond to different memory blocks (e.g., multiple memory blocks per string). For example, a first set of memory cells of a string may be included in a first memory block, and a second set of memory cells of the string may be included in a second memory block. The memory device may include separator wordlines disposed between wordlines associated with the first memory block and wordlines associated with the second memory block. The separator wordlines may receive different bias voltages during various operations of the memory device. Additionally, a wordline biasing scheme may be selected to program the first memory block based on whether the second memory block is programmed. Other embodiments may be described and/or claimed.

15 Claims, 9 Drawing Sheets

(56) References Cited

U.S. PATENT DOCUMENTS

| | | | |
|---|---|---|---|
| 2012/0051143 A1* | 3/2012 | Yoon | G11C 16/0483 365/185.22 |
| 2012/0068255 A1* | 3/2012 | Lee | H01L 27/11582 257/324 |
| 2013/0272067 A1* | 10/2013 | Lee | G11C 16/10 365/185.11 |
| 2014/0036590 A1 | 2/2014 | Feeley et al. | |

* cited by examiner

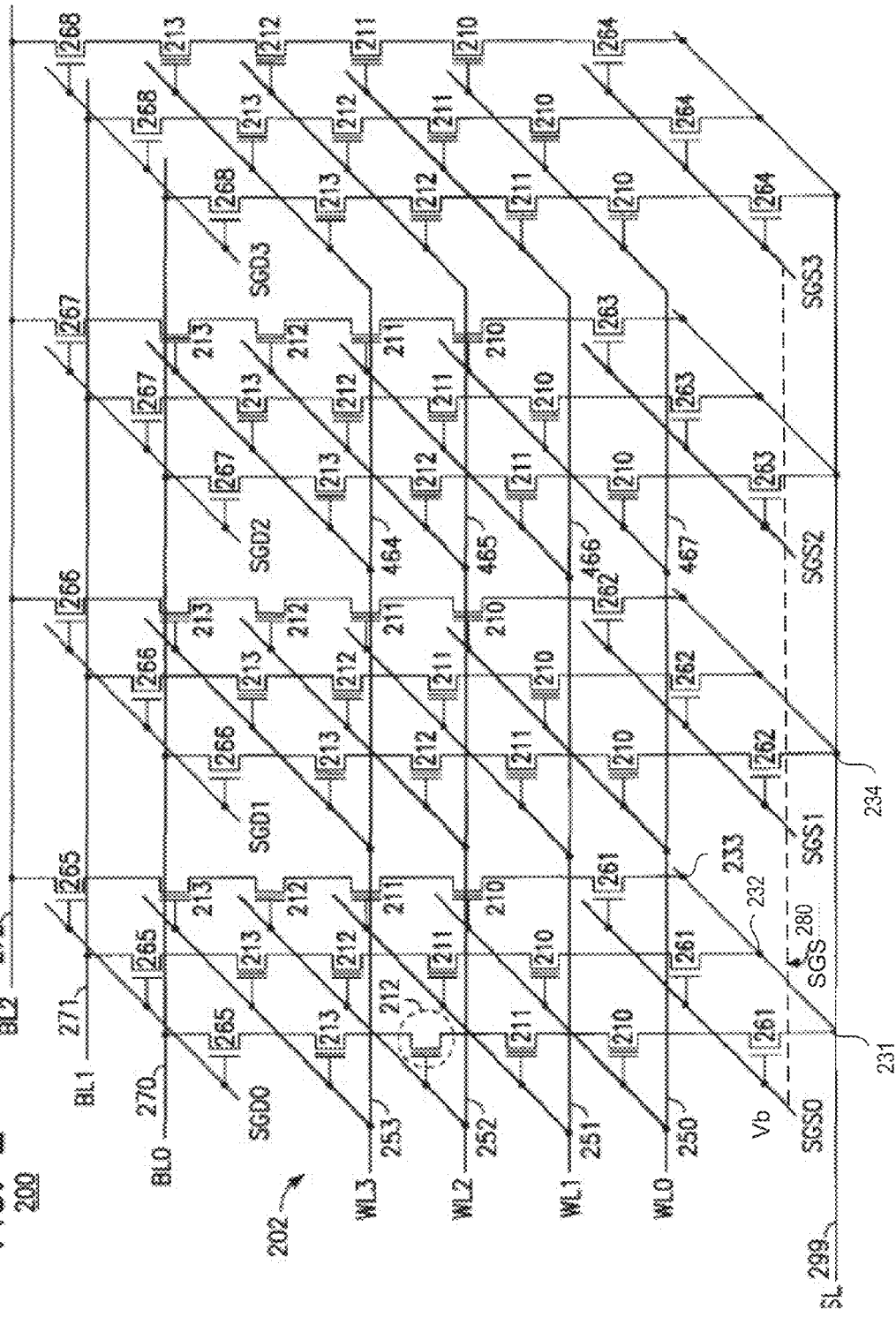

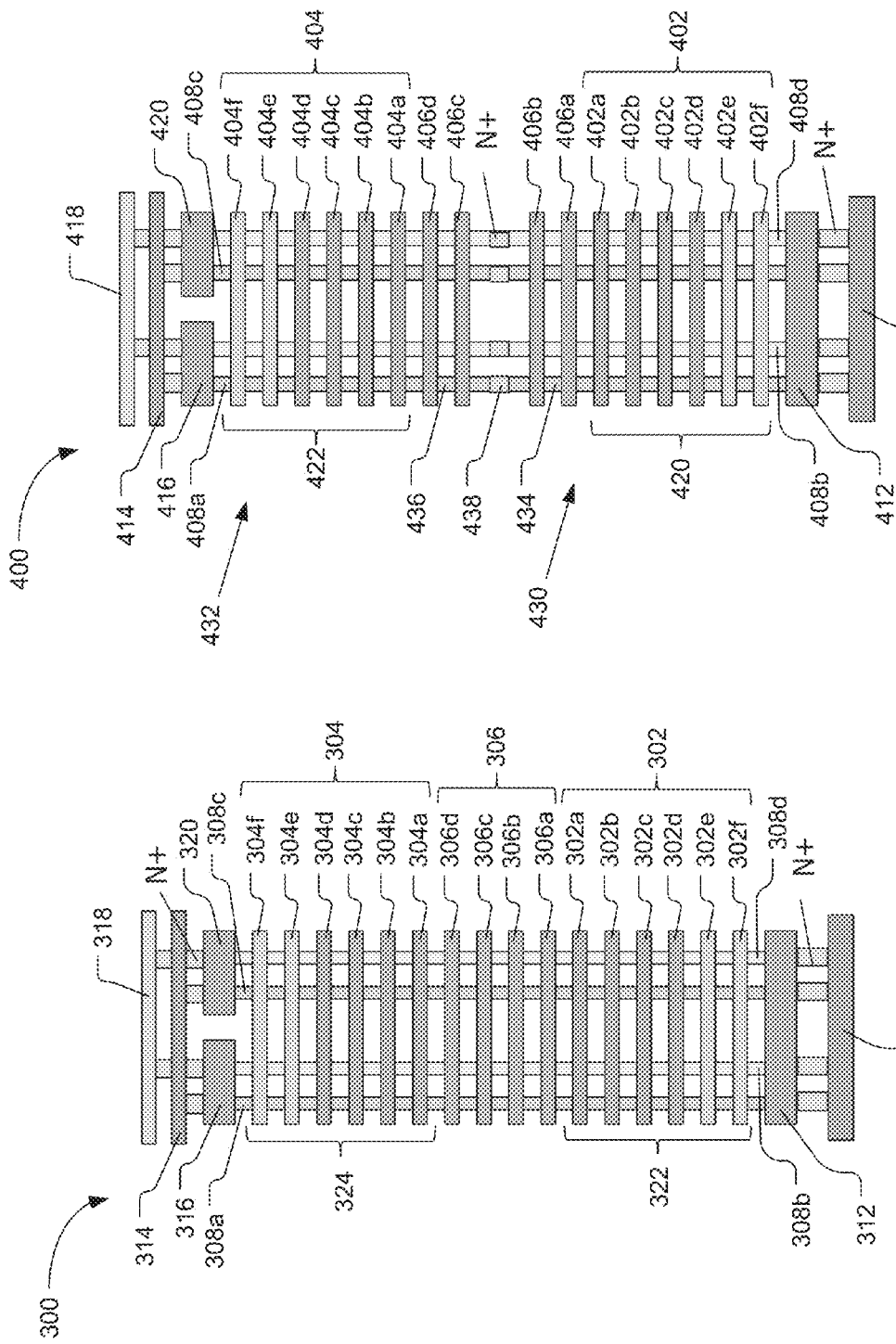

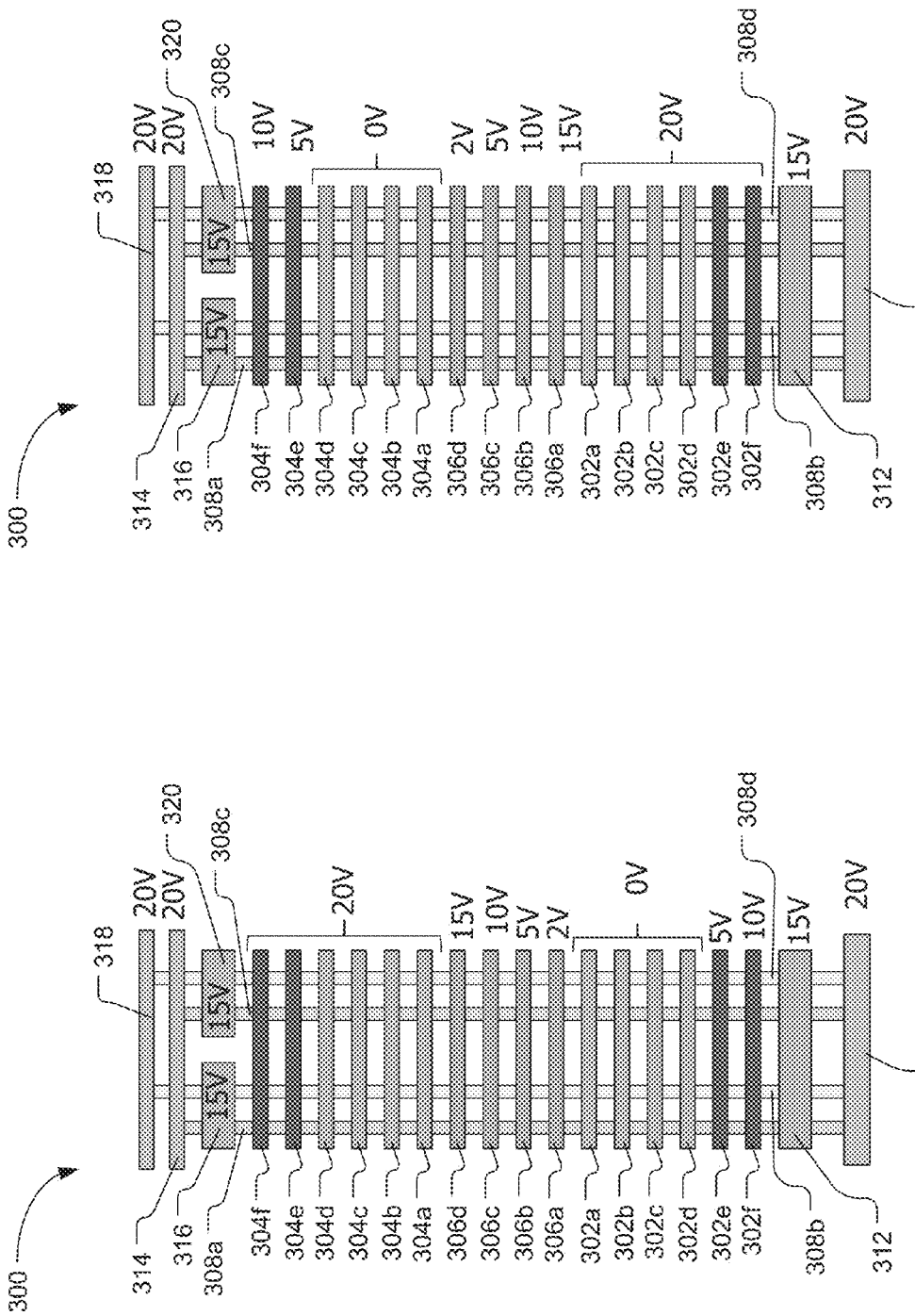

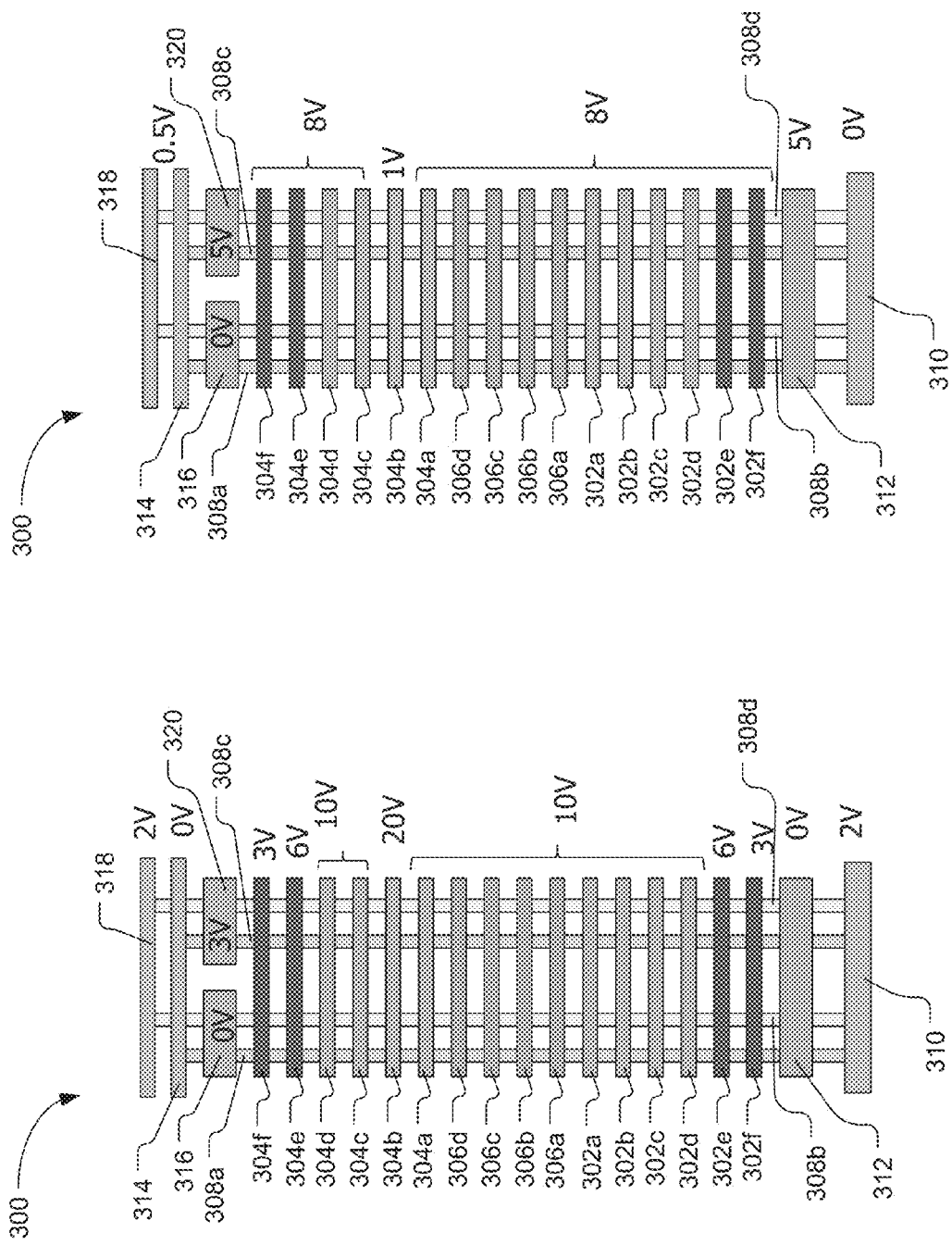

MULTIPLE BLOCKS PER STRING IN 3D NAND MEMORY

FIELD

Embodiments of the present disclosure generally relate to the field of integrated circuits (IC), and more particularly, to techniques associated with three-dimensional memory.

BACKGROUND

Memory provides data storage for electronic systems. Flash memory is one of various memory types, which has numerous uses in modern computers and devices. A typical flash memory may comprise a memory array that includes a large number of non-volatile memory cells arranged in row and column fashion. The cells may usually be grouped into blocks. Each of the cells within a block may be electrically programmed by charging a floating gate associated with the cell. Data may be stored in a cell as charge in the floating gate. The data may be erased by a block erase operation that removes the charges in the floating gates of cells of a block.

In recent years, vertical memory, such as three-dimensional (3D) memory has been developed. A 3D flash memory (e.g., 3D NAND memory array) device may include a plurality of strings of memory cells stacked over one another, with each memory cell of a string corresponding to one of multiple tiers of the device. The memory cells of a respective string may share a common channel region, such as one formed as a respective pillar of semiconductor material (e.g., polysilicon) about which the string of memory cells may be formed.

In another dimension of the 3D flash memory device, a group of strings may share a plurality of access lines, known as wordlines (WLs). Each of the plurality of wordlines may be coupled (e.g., electrically or otherwise operably connected) with respective memory cells of each string in the group of strings.

In a third dimension of the 3D flash memory device, groups of strings may be coupled to respective data lines of a set of data lines, known as bitlines (BLs). A 3D memory may be divided into memory blocks, comprising a plurality of memory pages, selectable via drain-side select gate (hereinafter select gate drain (SGD)) devices and source-side select gate (select gate source (SGS)) devices that may be provided over each end of the pillars to control memory cells. A 3D NAND memory array may utilize floating body pillars with SGS and SGD at the edge. A block of memory cells may correspond to a smallest group of memory cells that can be erased by a block erase operation (e.g., it is not possible to erase some memory cells of a block while maintaining the data in other memory cells of the block).

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 2 illustrates an example schematic diagram a 3D memory array suitable for use with the memory device of FIG. 1, in accordance with some embodiments.

FIG. 3 schematically illustrates a memory device with multiple memory blocks per string in accordance with some embodiments.

FIG. 4 schematically illustrates a memory device with multiple memory blocks per string and having a double deck configuration, in accordance with some embodiments.

FIG. 5 illustrates the memory device of FIG. 3, showing various voltages that may be applied to the memory device during a first block erase operation, in accordance with some embodiments.

FIG. 6 illustrates the memory device of FIG. 3, showing various voltages that may be applied to the memory device during a second block erase operation, in accordance with some embodiments.

FIG. 10 illustrates the memory device of FIG. 3, showing various voltages that may be applied to the memory device during a program operation, in accordance with some embodiments.

FIG. 11 illustrates the memory device of FIG. 3, showing various voltages that may be applied to the memory device during a read operation and/or a program verify operation, in accordance with some embodiments.

DETAILED DESCRIPTION

Figure 1:
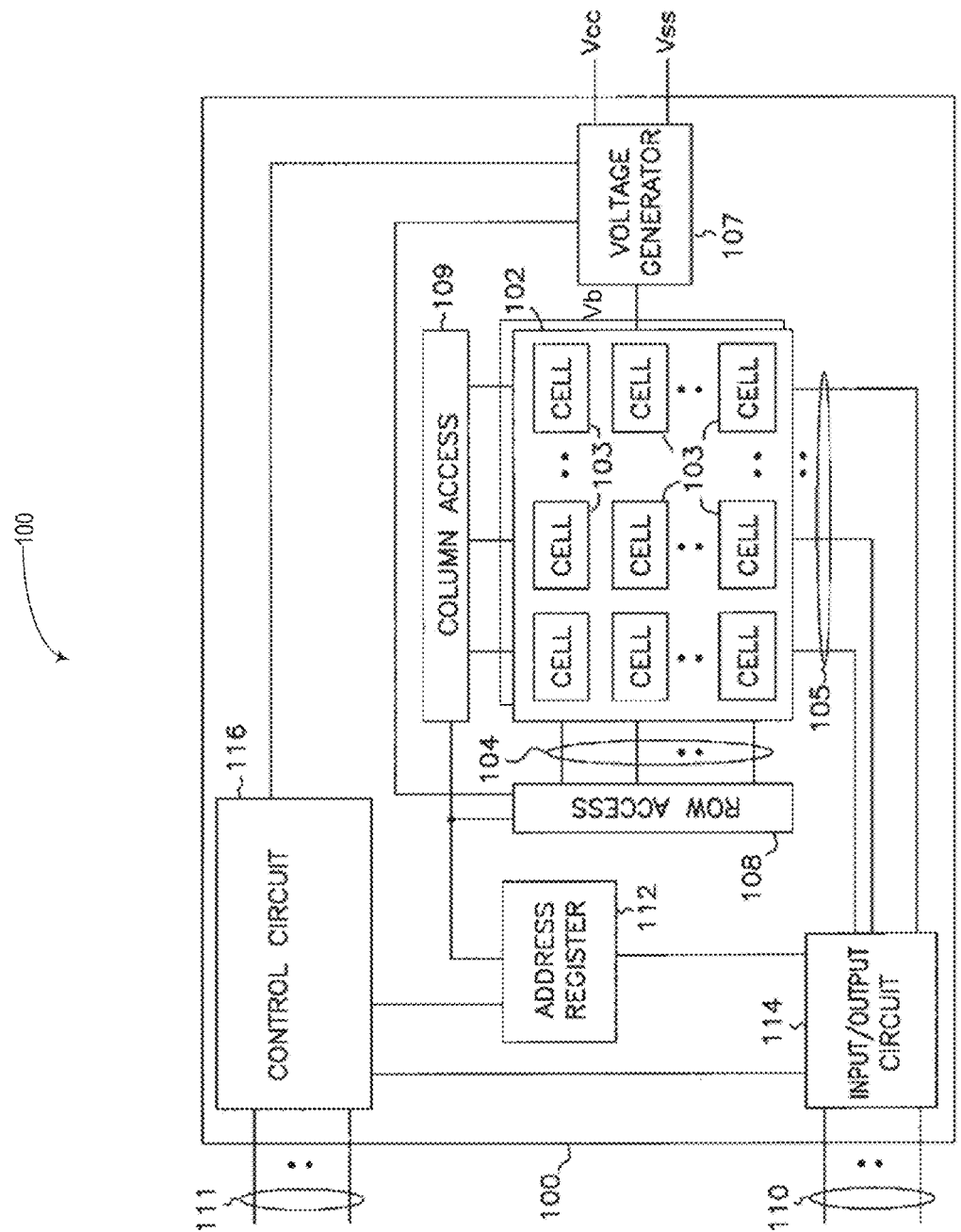
FIG. 1 illustrates an example memory device comprising a 3D memory array, in accordance with some embodiments of the present disclosure.

Embodiments of the present disclosure describe techniques and configurations for an apparatus including a three-dimensional (3D) memory array having a plurality of strings of memory cells, where individual strings may have memory cells that correspond to different memory blocks (e.g., multiple memory blocks per string). For example, a first set of memory cells of a string may be included in a first memory block, and a second set of memory cells of the string may be included in a second memory block. The memory device may include separator wordlines disposed between wordlines associated with the first memory block and wordlines associated with the second memory block. The separator wordlines may receive different bias voltages during various operations of the memory device. In some embodiments, the separator wordlines may be coupled with dummy memory cells of the 3D memory array that are not used to store data. Additionally, a wordline biasing scheme may be selected to program the first memory block based on whether the second memory block is programmed. These and other aspects will be described in more detail below with references to the Figures.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 is an example apparatus comprising a 3D memory array incorporated with one or more techniques of the present disclosure, in accordance with some embodiments. More specifically, the apparatus may include a memory device 100 with a 3D memory array 102 having stacked planes of memory cells 103 that may be arranged in rows and columns along with lines (e.g., wordlines) 104 and lines (e.g., data lines) 105. Memory device 100 may use lines 104 to access memory cells 103 and lines 105 to exchange information with memory cells 103. Row access circuitry 108 and column access circuitry 109 may respond to an address register 112 to access memory cells 103 based on row address and column address signals on lines 110, 111, or both. A data input/output circuit 114 may be configured to exchange data between memory cells 103 and lines 110.

Circuitry including a control circuit 116 may control operations of device 100 based on signals present on lines 110 and 111. A processing device (e.g., a processor or a memory controller) external to memory device 100 may send different commands (e.g., read, write, or erase command) to memory device 100 using different combinations of signals on lines 110, 111, or both. Control circuit 116 may respond to commands to perform memory operations of accessing a memory cell(s), such as a read operation to read information from memory cells 103 and a write (e.g., programming) operation to store (e.g., program) information into memory cells 103. Control circuit 116 may also perform an erase operation to clear information from some or all of memory cells 103. During various operations, control circuit 116 may cause various memory blocks (groups of memory cells) to be selected or deselected.

Memory device 100 may receive a supply voltage, including supply voltages Vcc and Vss. Supply voltage Vss may operate at a ground potential (e.g., having a value of approximately zero volts). Supply voltage Vcc may include an external voltage supplied to memory device 100 from an external power source such as a battery or alternating current to direct current (AC-DC) converter circuitry. Further, memory device 100 may include a voltage generator 107. Control circuit 116 (or parts thereof) may be configured to cause voltage generator 107 to generate different voltages for use during memory operations of memory device 100. For example, voltages generated by voltage generator 107 may be applied to lines 104 during a read or write operation to access memory cells 103. Voltage generator 107 and control circuit 116 (or parts thereof) may be referred to separately or together as circuitry to cause the application of different voltages to components (e.g., lines 104) of memory device 100, including bias voltages according to various embodiments of this disclosure. In embodiments, control circuit 116 and voltage generator 107 may be incorporated with techniques of the present disclosure, for example, to provide bias voltages to lines 104 as further discussed below.

Memory device 100 may include a non-volatile memory device and memory cells 103 may include non-volatile memory cells, such that memory cells 103 may retain information stored thereon when power (e.g., Vcc, Vss, or both) is disconnected from memory device 100. Each of memory cells 103 may be programmed to store information representing a value of a single bit, or a value of multiple bits such as two, three, four, or another number of bits.

Memory device 100 may be a flash memory device, such as a NAND flash or a NOR flash memory device, or another kind of memory device. Memory device 100 may include a memory array where memory cells 103 may be physically located in multiple levels on the same device, such that some of memory cells 103 may be stacked over some other memory cells 103 in multiple levels over a substrate (e.g., a semiconductor substrate) of memory device 100, forming pillars. One of ordinary skill in the art may recognize that memory device 100 may include other elements, several of which are not shown in FIG. 1, so as not to obscure the example embodiments described herein FIG. 2 is an example schematic diagram of an apparatus comprising a memory device 200 with a 3D memory array 202 suitable for use with memory device 100, in accordance with some embodiments. Memory device 200 may be associated with memory device 100 of FIG. 1, such as forming a portion of 3D memory array 102 of memory device 100. Memory device 200 may include lines (e.g., wordlines) 250, 251, 252, and 253 that may carry corresponding signals WL0, WL1, WL2, and WL3, and may form at least part of access lines of memory device 200. Lines 250, 251, 252, and 253 may correspond to lines 104 of FIG. 1. Memory device 200 may include data lines (bitlines) 270, 271, and 272 that carry signals BL0, BL1, and BL2, respectively. Bitlines 270, 271, and 272 may correspond to lines 105 of FIG. 1.

Four lines (access lines or wordlines) 250, 251, 252, and 253 and three bitlines 270, 271, and 272 are shown in FIG. 2 as an illustrative example only. The number of these lines may vary. Memory device 200 may include memory cells 210, 211, 212, and 213, and transistors 261, 262, 263, 264, 265, 266, 267, and 268. These memory cells 210, 211, 212, and 213 and transistors 261 through 268 may be arranged in memory cell strings, such as memory cell strings 231, 232, and 233. The memory cells of a given memory cell string may share a common channel region (e.g., pillar). For simplicity, in FIG. 2, only three of the memory cell strings are labeled (231, 232, and 233). The memory array 202 shown in FIG. 2 includes nine memory cell strings and four memory cells 210, 211, 212, and 213 in each memory cell string.

In summary, the example memory array 202 shown in FIG. 2 is provided for illustrative purposes and is not limiting to this disclosure. One skilled in the art will appreciate that the number of access lines, number of memory cell strings (pillars), and number of memory cells in each memory cell string may vary.

Memory cells 210, 211, 212, and 213 may be physically located in multiple levels of memory device 200, such that memory cells 210, 211, 212, and 213 in the same memory cell string may be stacked over each other in multiple levels of memory device 200, forming a pillar. As shown in FIG. 2, transistors 261 through 268 and may be controlled (e.g., turned on or turned off) by corresponding signals SGD0, SGD1, SGD2, and SGD3, and SGS0, SGS1, SGS2, and SGS3 provided via corresponding lines as shown to couple the memory cell strings to their respective bitlines 270, 271, and 272, and a line 299, during a memory operation, such as a write operation. In some embodiments, depending on a desired memory array 202 configuration, the lines carrying signals SGS0, SGS1, SGS2, and SGS3 may be connected via a common SGS line 280, as shown.

Line 299 may include a common source line of memory device 200 and may carry a signal, such as signal SL. In a memory operation, such as a write operation, different voltages may be applied to lines 250, 251, 252, and 253 to selectively access memory cells 210, 211, 212, and 213 in order to store information into one or more selected memory cell among memory cells 210, 211, 212, and 213. For example, in a write operation, memory device 200 may select memory cell 212 (shown within a dashed circle) of memory cell string 231 to store information into memory cell 212. In this example, memory device 200 may apply a voltage to line 252 and other voltages to lines 250, 251, and 253. The voltage on lines 250, 251, and 253 may have the same or different values. Memory device 200 may include memory devices and operate using memory operations (e.g., write operations) similar to or identical to memory devices and operations described below with reference to FIG. 3 through FIG. 11. For example, one or more wordlines 250, 251, 252, or 253 of the memory device 200 may be separator wordlines to separate wordlines associated with a first memory block from wordlines associated with a second memory block. The one or more separator wordlines may be coupled to dummy memory cells that are not used to store data.

In embodiments, the memory array 202 may comprise one or more memory blocks (each having a plurality of memory cells) disposed in a die, such as a NAND die, for example. A memory block may have different memory capacities, depending on technological demand. In operation, such as when a memory array is to be accessed for data erasure, data programming, or data reading, a memory block may be selected (e.g., for erasure, programming, or reading) or deselected, in order to refrain from erasing, programming, or reading deselected blocks while the selected block(s) are being erased, programmed, or read. Accordingly, in a memory array having a plurality of memory blocks, at least one block may be selected for access (e.g., for a program mode or read mode), while other blocks may be deselected in order to refrain from access. Selection and deselection of memory blocks may be accomplished by application of particular voltage values to respective wordlines and SGS lines.

FIG. 3 schematically illustrates a side view of a memory device 300 having a plurality of separator wordlines, in accordance with various embodiments. The memory device 300 may include a first set of wordlines 302 (e.g., including wordlines 302a-f), a second set of wordlines 304 (e.g., including wordlines 304a-f), and a plurality of separator wordlines 306 (e.g., including separator wordlines 306a-d). The memory device 300 may further include a plurality of strings 308a-d of memory cells. The memory cells are represented in FIG. 3 by the locations where the wordlines 302a-f, 304a-f, and 306a-d intersect with the strings 308a-d. The memory cells of individual strings 308a-d may share a common channel region (e.g., formed as a pillar). In various embodiments, the first set of wordlines 302 and second set of wordlines 304 may be coupled to respective individual memory cells of the plurality of strings 308a-d. In some embodiments, the separator wordlines 306 may be coupled to respective dummy memory cells of the plurality of strings 308a-d that are not used for storing data, as further discussed below.

At one end of the strings 308a-d, the strings 308a-d may be coupled with a source line 310 of the memory device 300 via a SGS line 312. At the other end, string 308a may be coupled to a first bitline 314 via a first SGD line 316, string 308b may be coupled to a second bitline 318 via first SGD line 316, string 308c may be coupled to the first bitline 314 via a second SGD line 320, and string 308d may be coupled to the second bitline 318 via the second SGD line 320. Accordingly, the strings 308a-d may be individually accessed using the bitlines 314 and 318 and SGD contacts 316 and 320.

In various embodiments, the strings 308a and 308c may be located on a first level (e.g., plane) of the memory device 300 (e.g., along with the first bitline 314), and the strings 308b and 308d may be located on a second level (e.g., plane) of the memory device 300 (e.g., along with the second bitline 318) that is different from the first level. For example, as viewed in FIG. 3, the second level may be behind the first level. In some embodiments, the string 308b may be directly behind the string 308a, and the string 308d may be directly behind the string 308c, but the strings 308a-d are illustrated as being adjacent to one another in FIG. 3 for ease of illustration.

The numbers of wordlines in the first set of wordlines 302, wordlines in the second set of wordlines 304, strings 308a-d, bitlines 314 and 318, and/or SGD lines 316 and 320 are shown in FIG. 3 for illustration purposes, and it will be apparent that various embodiments may include any suitable numbers of wordlines in the first set of wordlines 302, wordlines in the second set of wordlines 304, strings 308a-d, bitlines 314 and 318, and/or SGD lines 316 and 320, including significantly greater numbers than those shown in FIG. 3.

In various embodiments, a first set of memory cells 322 of the string 308a (e.g., that are accessed by the first set of wordlines 302) may be included in a first memory block of the memory device 300, and a second set of memory cells 324 of the string 308a (e.g., that are accessed by the second set of wordlines 304) may be included in a second memory block of the memory device 300. In some embodiments, the memory block (e.g., first or second memory block) may further include memory cells of one or more other strings, such as memory cells of other strings that are disposed in the same plane as the string 308a and coupled with the same set of wordlines. For example, memory cells of the string 308c that are accessed by the first set of wordlines 302 may be included in the first memory block, and memory cells of the string 308c that are accessed by the second set of wordlines 304 may be included in the second memory block. In other embodiments, the first and second memory blocks may only include memory cells of the string 308a.

In various embodiments, the first memory block and the second memory block may be erased by different block erase operations. For example, a first block erase operation may erase the first memory block of memory cells (e.g., including the first set of memory cells 322) without erasing the second memory block of memory cells (e.g., including the second set of memory cells 324). A second block erase operation may erase the second memory block of memory cells without erasing the first memory block of memory cells.

In various embodiments, the separator wordlines 306a-d in the memory device 300 may facilitate the first and/or second block erase operations. As further discussed below, in the block erase operation, a control circuit (e.g., the control circuit 116 in cooperation with the voltage generator 107 of FIG. 1) may apply a relatively low voltage (e.g., zero voltage) to wordlines corresponding to the memory block to be erased and apply a relatively high voltage to wordlines corresponding to the memory block that is not to be erased (e.g., the deselected memory block). When wordlines of the different blocks are adjacent to one another, the block erase operation may cause the wordlines to generate a high electric field, which may disrupt operation of the memory device 300. For example, for adjacent wordlines that are spaced 20 nanometers apart, a voltage difference between the adjacent wordlines of 20 volts may cause an electric field of about 10 Megavolts/centimeter (MV/cm). The separator wordlines 306a-d disposed between the first set of wordlines 302 and the second set of wordlines 304 may prevent a high electric field from being generated by the wordlines during the block erase operation. Accordingly, the separator wordlines 306a-d may allow memory cells of strings (e.g., string 308a) to be included in different memory blocks, thereby allowing for a smaller memory block size compared with prior memory configurations.

The memory device 300 may include any suitable number of one or more separator wordlines 306a-d, such as 2 or more separator wordlines. In some embodiments, the memory device 300 may include 2, 4, or 8 separator wordlines 306a-d. The number of separator wordlines 306a-d included in the memory device 300 may be application dependent, and may depend on one or more factors, such as the proximity of adjacent memory cells or wordlines, the strength of the electric field generated by the wordlines, the voltages used during operations (e.g., block erase, program, read) of the memory device, etc.

In some embodiments, the control circuit may provide bias voltages to the separator wordlines 306a-d during the block erase operation and/or other operations, e.g., as discussed further below with respect to FIGS. 5-11. The separator wordlines 306a-d may not be used to store (program) data to, or read data from, the memory device 300. In some embodiments, the separator wordlines 306a-d may be coupled to memory cells (e.g., dummy memory cells) of the strings 308a-d that are not used for storing data.

FIG. 4 illustrates a memory device 400 that is similar to memory device 300 but has a double deck configuration, in accordance with various embodiments. The memory device 400, may include a first set of wordlines 402 (including wordlines 402a-f), a second set of wordlines 404 (including wordlines 404a-f), separator wordlines 406a-d, and strings 408a-d that may be similar to the first set of wordlines 302, second set of wordlines 304, separator wordlines 306a-d, and strings 308a-d, respectively, of FIG. 3. The memory device 400 may further include a source line 410, SGS line 412, bit lines 414 and 418, and SGD lines 416 and 420 that may be similar to the source line 310, SGS line 312, bit lines 314 and 318, and SGD lines 316 and 320, respectively, of FIG. 3.

However, the memory device 400 may include a first deck 430 and a second deck 432. The first deck 430 and second deck 432 may be formed by separate processes. The strings 408a-d may include a first continuous pillar portion 434 that is disposed in the first deck 430 and a second continuous pillar portion 436 that is disposed in the second deck 432. The first pillar portion 434 and second pillar portion 436 may be coupled to one another by a doped (e.g., N-doped) collection region 438. The doped collection region 438 may reduce the impedance at the interface between the first pillar portion 434 and second pillar portion 436. The first pillar portion 434 and second pillar portion 436 of the same string 408a-d may be substantially co-linear.

In various embodiments, the first memory block may include memory cells on the first deck 430 (e.g., including the first set of memory cells 422 of string 408a), and the second memory block may include memory cells on the second deck 432 (e.g., including the second set of memory cells 424 of string 408a). In some embodiments, one or more of the separator wordlines (e.g., separator wordlines 406a-b) may be included in the first deck 430 and one or more of the separator wordlines (e.g., separator wordlines 406c-d) may be included in the second deck 432. In other embodiments, all of the separator wordlines 406a-d may be included in the same deck (e.g., the first deck 430 or the second deck 432).

FIG. 5 illustrates the memory device 300 during a first block erase operation, and shows various voltages (e.g., bias voltages) that may be applied to components of the memory device 300 as part of the first block erase operation. The first block erase operation may use the first set of wordlines 302 to erase the memory cells of the first memory block (e.g., including the first set of memory cells 322) without erasing the second block of memory cells (e.g., including the second set of memory cells 324). The values of the voltages shown in FIG. 5 are presented as examples, and it will be apparent that other values of the voltages may be used in other embodiments. Additionally, while the memory device 300 is shown in FIG. 5 with 4 separator wordlines 306a-d, other embodiments may include a different number of separator wordlines. The bias voltages applied to the separator wordlines and/or other wordlines during the first block erase operation may be determined, at least in part, by the number of separator wordlines included in the memory device. In various embodiments, the voltages may be applied to the memory device 300 by the control circuit (e.g., the control circuit 116 in cooperation with the voltage generator 107 of FIG. 1).

In various embodiments, an erase select voltage, such as 0 Volts (V), may be applied to wordlines 302a-d of the first set of wordlines 302. An erase deselect voltage, such as 20V, may be applied to wordlines 304a-f of the second set of wordlines 304. The separator wordlines 306a-d may be provided with different bias voltages having values between the erase select voltage and the erase deselect voltage. Accordingly, the erase select voltage may be less than the bias voltages, and the erase deselect voltage may be greater than the bias voltages.

The values of the bias voltages applied to the separator wordlines 306a-d may be stepped such that the closer the separator wordline is to the wordlines associated with the deselected block (e.g., the second set of wordlines 304), the higher the bias voltage that is applied to the separator wordline. For example, as shown in FIG. 5, the separator wordline 306a may receive a bias voltage of about 2V, the separator wordline 306b may receive a bias voltage of about 5V, the separator wordline 306c may receive a bias voltage of about 10V, and the separator wordline 306d may receive a bias voltage of about 15V. Other values for the bias voltages applied to the separator wordlines 306a-d may be used in other embodiments (e.g., depending on the number of separator wordlines 306a-d, the values of the erase select voltage and/or erase deselect voltage, etc.). The stepped bias voltages applied to the separator wordlines 306a-d may limit the voltage difference between adjacent wordlines and thereby limit the resulting electric field.

In various embodiments, the source line 310 and/or bit lines 314 and 318 may receive a voltage of about 20V (e.g., equal to the erase deselect voltage). The SGS line 312 and/or SGD lines 316 and 320 may receive an intermediate voltage, such as 15V. Accordingly, a voltage of about 20V may be passed through the channel region of the strings 308a-d, and memory cells that are coupled with the wordlines 302a-d (that receive the erase select voltage) may be erased.

In some embodiments, wordlines of the first memory block that are adjacent the source region (e.g., wordlines 302e-f) may receive voltages that are above the erase select voltage. For example, wordline 302e may receive a voltage of about 5V and wordline 302f may receive a voltage of about 10V. At such applied voltages, the block erase operation may not reliably erase the memory cells coupled to the wordlines 302e-f, and thus those memory cells may not be used to store data. Accordingly, in some embodiments, the memory cells of string 308a that are accessed by wordlines 302e-f may not be considered part of the first memory block. In a similar manner, the memory cells of string 308a that are accessed by wordlines 304e-f may not be considered part of the second memory block in some embodiments.

FIG. 6 schematically illustrates the memory device 300 during a second block erase operation, and shows various voltages (e.g., bias voltages) that are applied to components of the memory device 300 as part of the second block erase operation. The second block erase operation may use the second set of wordlines 304 to erase the memory cells of the second memory block (e.g., including the second set of memory cells 324) without erasing the first block of memory cells (e.g., including the first set of memory cells 322).

The values of the voltages shown in FIG. 6 are presented as examples, and it will be apparent that other values of the voltages may be used in other embodiments. Additionally, while the memory device 300 is shown in FIG. 6 with 4 separator wordlines 306a-d, other embodiments may include a different number of separator wordlines. The bias voltages applied to the separator wordlines and/or other wordlines during the second block erase operation may be determined, at least in part, by the number of separator wordlines included in the memory device. In various embodiments, the voltages may be applied to the memory device 300 by the control circuit (e.g., the control circuit 116 in cooperation with the voltage generator 107 of FIG. 1).

As shown in FIG. 6, an erase select voltage, such as 0V, may be applied to wordlines 304a-d of the second set of wordlines 304. An erase deselect voltage, such as 20V, may be applied to wordlines 302a-f of the first set of wordlines 302. The separator wordlines 306a-d may be provided with different bias voltages having values between the erase select voltage and the erase deselect voltage. The values of the bias voltages applied to the separator wordlines 306a-d may be stepped such that the closer the separator wordline is to the wordlines associated with the deselected block (e.g., the first set of wordlines 302), the higher the bias voltage that is applied to the separator wordline. For example, as shown in FIG. 6, the separator wordline 306d may receive a bias voltage of about 2V, the separator wordline 306c may receive a bias voltage of about 5V, the separator wordline 306b may receive a bias voltage of about 10V, and the separator wordline 306a may receive a bias voltage of about 15V.

Figure 7:
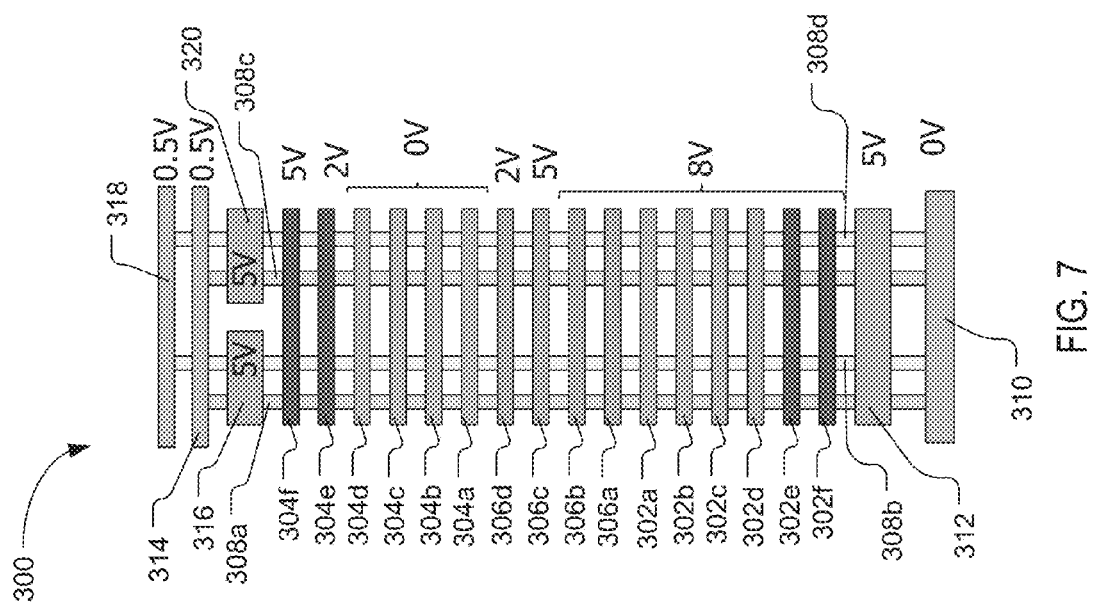
FIG. 7 illustrates the memory device of FIG. 3, showing various voltages that may be applied to the memory device during an erase verify operation, in accordance with some embodiments.

FIG. 7 schematically illustrates the memory device 300 during an erase verify operation and shows various voltages (e.g., bias voltages) that are applied to components of the memory device 300 as part of the erase verify operation. The erase verify operation illustrated in FIG. 7 may be used after the second block erase operation to verify that the second memory block has been erased.

The values of the voltages shown in FIG. 7 are presented as examples, and it will be apparent that other values of the voltages may be used in other embodiments. Additionally, while the memory device 300 is shown in FIG. 7 with 4 separator wordlines 306a-d, other embodiments may include a different number of separator wordlines. The bias voltages applied to the separator wordlines and/or other wordlines during the erase verify operation may be determined, at least in part, by the number of separator wordlines included in the memory device. In various embodiments, the voltages may be applied to the memory device 300 by the control circuit (e.g., the control circuit 116 in cooperation with the voltage generator 107 of FIG. 1).

As shown in FIG. 7, as part of the erase verify operation, the wordlines 304a-d of the second set of wordlines 304 may receive an erase verify voltage that may be equal to the erase select voltage (e.g., about 0V) and the wordlines 302a-f of the first set of wordlines 302 may receive a bias voltage (e.g., about 8V) to cause memory cells of the first memory block to operate as pass-gates to allow the erasure of the second memory block to be verified. In some embodiments, the separator wordlines 306a-b may also receive the bias voltage of about 8V to cause memory cells associated with the separator wordlines 306a-b to operate as pass-gates. The separator wordlines 306c and 306d, that are closer to the second set of wordlines 304 than the separator wordlines 306a-b, may receive bias voltages of about 5V and about 2V, respectively. The SGS line 312 and SGD lines 316 and 320 may receive bias voltages of about 5V, the source line 310 may receive a bias voltage of about 0V, and bit lines 314 and 318 may receive bias voltages of about 0.5V. The wordline 304e may receive a bias voltage of about 2V, and the wordline 304f may receive a bias voltage of about 5V.

Figure 8:
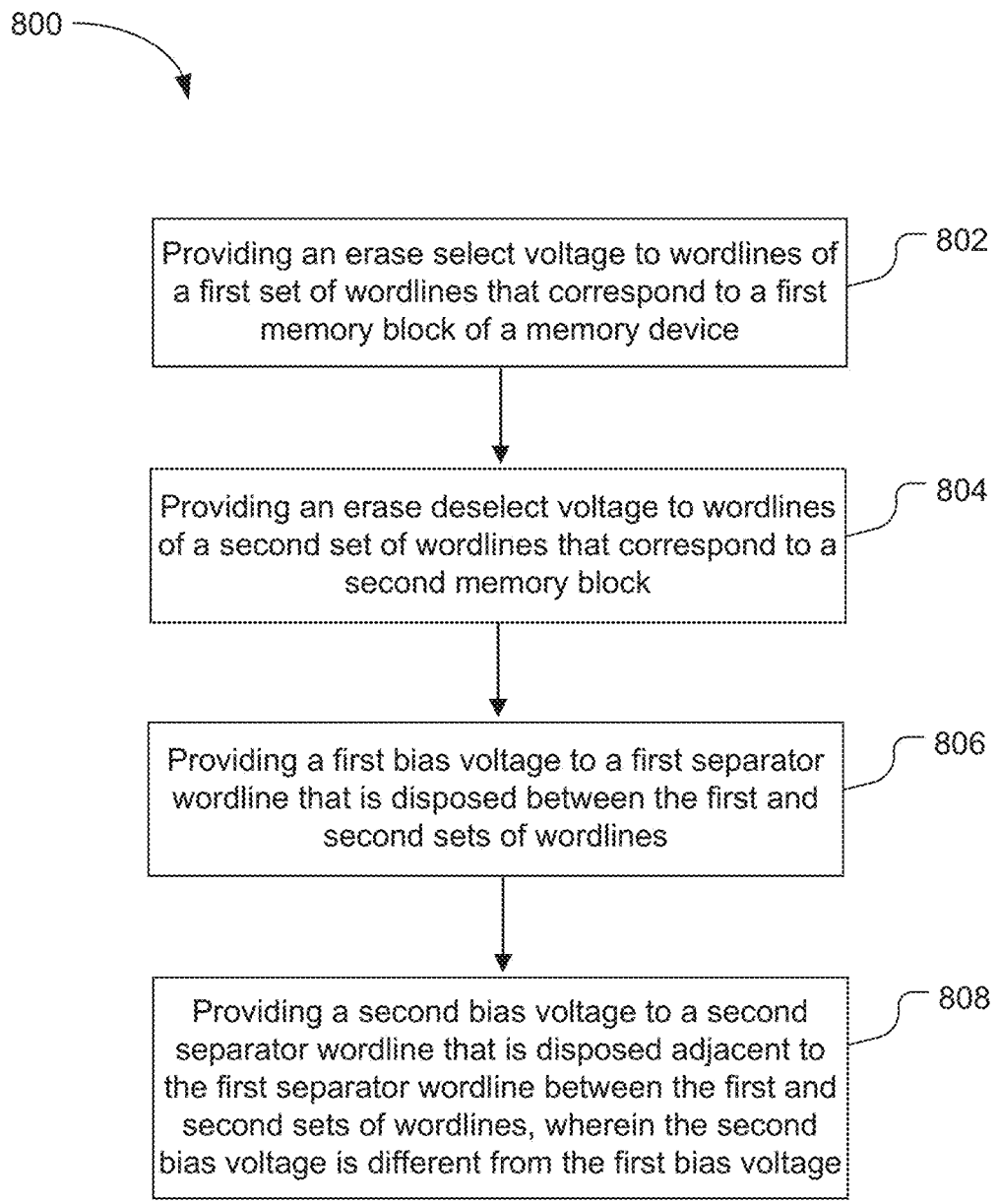
FIG. 8 is a flow diagram that illustrates a method for erasing a memory block of a memory device, in accordance with some embodiments.

FIG. 8 is a flow diagram that illustrates a method 800 for erasing a memory block of a memory device (e.g., memory device 300 or 400) that includes multiple memory blocks per string, in accordance with various embodiments. In some embodiments, the method 800 may be performed by a control circuit, such as control circuit 116 in cooperation with voltage generator 107. Additionally, or alternatively, in some embodiments, one or more non-transitory computer-readable media may have instructions, stored thereon, that when executed by one or more processors cause a device to perform the method 800. The method 800 may be used to erase a first memory block of the memory device without erasing a second memory block of the memory device, where the first and second memory blocks each include memory cells from the same string of memory cells.

At 802, the method 800 may include providing an erase select voltage to wordlines of a first set of wordlines that correspond to a first memory block of a memory device. The erase select voltage may be, for example, 0V. In some embodiments, the memory device may be a 3D memory device, such as the memory device 300 or 400.

At 804, the method 800 may include providing an erase deselect voltage to wordlines of a second set of wordlines that correspond to a second memory block. The erase deselect voltage may be a positive voltage, such as 20V. In some embodiments, the first and second sets of wordlines may include respective memory cells from one or more of the same strings of memory cells of the memory device. For example, the first memory block may include a first set of memory cells of a string, and the second memory block may include a second set of memory cells of the string.

At 806, the method 800 may include providing a first bias voltage to a first separator wordline that is disposed between the first and second sets of wordlines.

At 808, the method 800 may include providing a second bias voltage to a second separator wordline that is disposed adjacent to the first separator wordline between the first and second sets of wordlines. The first and second bias voltages may be different from one another and may both have values between the erase select voltage and the erase deselect voltage. In some embodiments, the first separator wordline may be disposed between the second separator wordline and the first set of wordlines, and the first bias voltage may be less than the second bias voltage.

Various operations of the method 800 are described as multiple discrete operations, in a manner that is most helpful in understanding the claimed subject matter. However, the order of description should not be construed as to imply that these operations are necessarily order dependent. It will be appreciated that sequence of operations associated with method 800 may vary and/or include other actions in accordance with the present disclosure.

Referring again to FIG. 3, the memory cells of the memory device 300 may be programmed by a program operation. In various embodiments, the control circuit may select memory cells of one memory block (e.g., the first memory block) for programming. For example, the control circuit may select memory cells of the first memory block corresponding to a page (e.g., that are accessed by the same wordline). The control circuit may then determine whether memory cells of the second memory block have been programmed, and may determine a wordline biasing scheme to use for programming the memory cells of the first block based on the determination of whether memory cells of the second memory block have been programmed. For example, the control circuit may generally use higher bias voltages for deselected wordlines of the first memory block and/or wordlines of the second memory block if data is programmed to the second block than if data is not programmed to the second block.

In some embodiments, the control circuit may check a flag for the deselected block and/or a flag for one or more wordlines of the deselected block to determine whether the deselected block is programmed. For example, the control circuit may check the flag of one or more pre-determined wordlines (e.g., wordline 304c) of the deselected block. In some embodiments, the control circuit may apply a first wordline biasing scheme if the flag for the block or the pre-determined wordline indicates that the deselected block or the pre-determined wordline has been programmed and may apply a second wordline biasing scheme if the flag indicates that the block or the deselected block or the pre-determined wordline has not been programmed. In other embodiments, the control circuit may check flags for multiple wordlines of the deselected block to get more detailed information on the data pattern that is stored in the deselected block. The control circuit may determine the wordline biasing scheme to use for programming memory cells of the selected block based on the flags. In some embodiments, the control circuitry may also take into account the proximity of the selected wordline to the deselected block when selecting the wordline biasing scheme.

Figure 9:
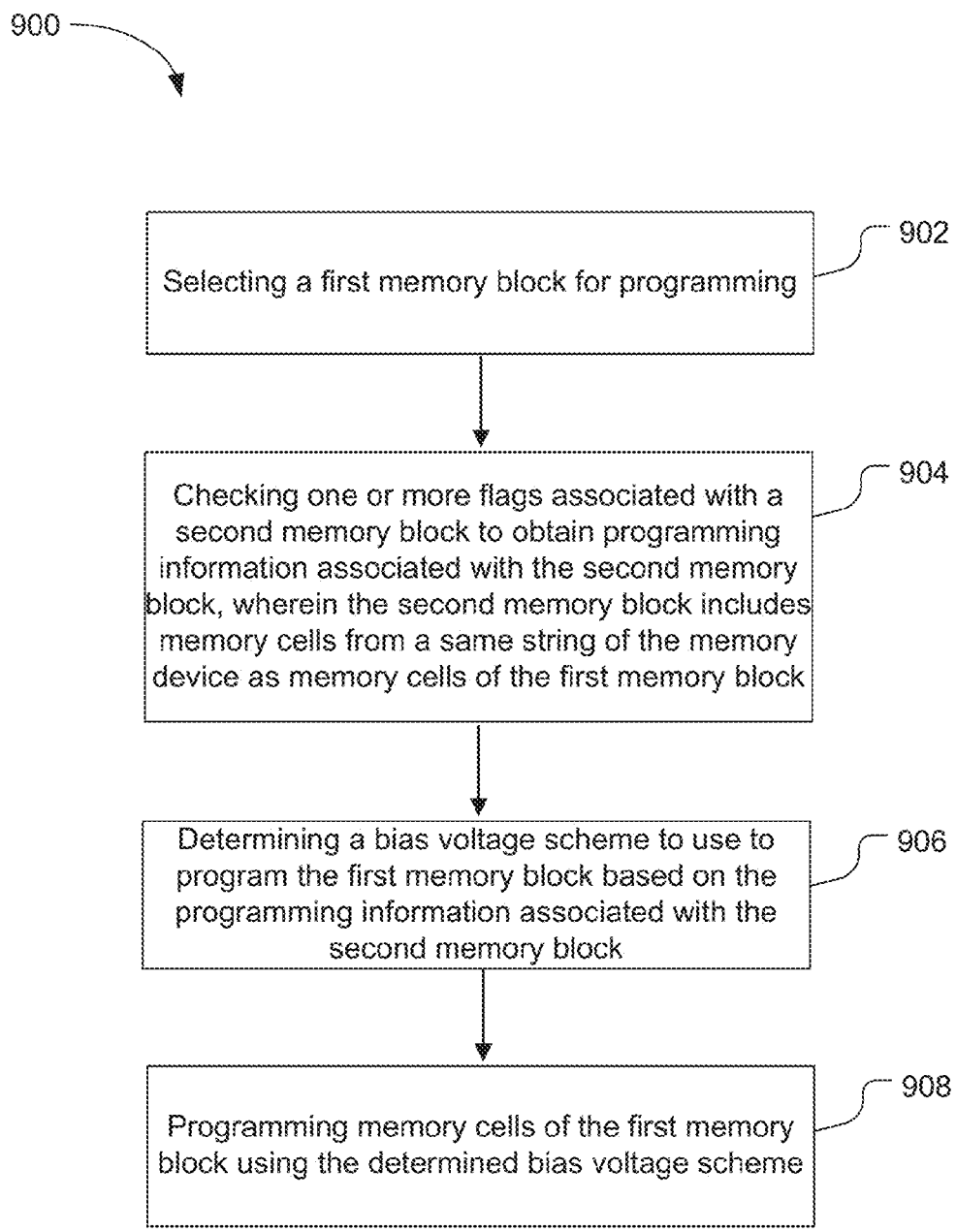
FIG. 9 is a flow diagram that illustrates a method for programming a memory block of a memory device, in accordance with some embodiments.

FIG. 9 illustrates a method 900 for programming a memory device (e.g., memory device 300 or 400) that includes multiple memory blocks per string, in accordance with various embodiments. In some embodiments, the method 800 may be performed by a control circuit, such as control circuit 116 in cooperation with voltage generator 107. Additionally, or alternatively, in some embodiments, one or more non-transitory computer-readable media may have instructions, stored thereon, that when executed by one or more processors cause a device to perform the method 900.

At 902, the method 900 may include selecting a first memory block (e.g., a page of a first memory block) for programming.

At 904, the method 900 may include checking one or more flags associated with a second memory block to obtain programming information associated with the second memory block, wherein the second memory block includes memory cells from a same string of the memory device as memory cells of the first memory block. For example, control circuit may check one or more flags for the second memory block or for one or more pre-determined wordlines associated with the second memory block. The flags may indicate whether the associated memory resources are programmed (e.g., presently storing data).

At 906, the method 900 may include determining a bias voltage scheme to use to program the first memory block based on the programming information associated with the second memory block. For example, if data is programmed in the second memory block, a bias voltage scheme that uses relatively higher bias voltages for deselected wordlines may be used, and if data is not programmed in the second memory block, a bias voltage scheme that uses relatively lower bias voltages for deselected wordlines may be used.

At 908, the method 900 may include programming memory cells of the first memory block using the determined bias voltage scheme.

Various operations of the method 900 are described as multiple discrete operations, in a manner that is most helpful in understanding the claimed subject matter. However, the order of description should not be construed as to imply that these operations are necessarily order dependent. It will be appreciated that sequence of operations associated with method 900 may vary and/or include other actions in accordance with the present disclosure.

In various embodiments, the control circuitry may additionally or alternatively determine a bias voltage scheme to use for a read operation to read memory cells of the first memory block based on programming information associated with the second memory block. The control circuit may determine the programming information associated with the second memory block in a similar manner to that described above with respect to the program operation, for example by checking one or more flags associated with the second memory block and/or wordlines associated with the second memory block. The control circuitry may determine bias voltages to apply to wordlines of the memory device (e.g., to a wordline of the first memory block that is selected for read, wordlines of the first memory block that are deselected for read, wordlines of the second memory block, and/or separator wordlines) as part of the bias voltage scheme based on the programming information associated with the second memory block. The determined bias voltages may compensate for a shift in threshold voltages of memory cells in the second memory block that may be caused by the data pattern in the second memory block.

FIG. 10 illustrates the memory device 300 during a program operation, and shows various voltages (e.g., bias voltages) that are applied to the memory device 300 as part of the program operation. The values of the voltages shown in FIG. 10 are presented as examples, and it will be apparent that other values of the voltages may be used in other embodiments. Additionally, while the memory device 300 is shown in FIG. 10 with 4 separator wordlines 306*a-d*, other embodiments may include a different number of separator wordlines. The bias voltages applied to the separator wordlines and/or other wordlines during the program operation may be determined, at least in part, by the number of separator wordlines included in the memory device. In various embodiments, the voltages may be applied to the memory device 300 by the control circuit (e.g., the control circuit 116 in cooperation with the voltage generator 107 of FIG. 1).

The program operation may program one or more memory cells of the second memory block that are associated with wordline 304*b*. Accordingly, wordline 304*b* may receive a program select voltage, such as 20V. The other wordlines, including deselected wordlines 304*a* and 304*c-f* of the second memory block, wordlines 302*a-f* of the first memory block, and separator wordlines 306*a-d*, may receive bias voltages that are less than the program select voltage. For example, wordlines 302*a-d*, 304*a*, 304*c-d*, and 306*a-d* may receive a bias voltage of about 10V. The wordlines 302*e* and 304*e* may receive a bias voltage of about 6V, and the wordlines 302*f* and 304*f* may receive a bias voltage of about 3V. As discussed above, in some embodiments, the values of the bias voltages applied to the deselected wordlines may be determined based on whether the deselected memory block (e.g., the first memory block) is programmed. For example, the bias voltages may generally be higher when data is programmed in the deselected block than when data is not programmed in the deselected block.

As further shown in FIG. 10, the SGS line 312 may receive a bias voltage of about 0V, and the source line 310 may receive a bias voltage of about 2V. The SGD line 316 may receive a bias voltage of about 0V, and the SGD line 320 may receive a bias voltage of about 3V. The bit line 314 may receive a voltage of about 0V, and the bit line 318 may receive a voltage of about 2V. With these voltages, the memory cell of the string 308*c* that corresponds to the wordline 304*b* may be programmed to a positive programmed voltage (e.g., which may correspond to a logic 0). Programming in the other memory cells may be inhibited with the voltages shown in FIG. 10.

FIG. 11 illustrates the memory device 300 during a read operation or a program verify operation, and shows various voltages (e.g., bias voltages) that are applied to components of the memory device 300 as part of the read operation or the program verify operation. The values of the voltages shown in FIG. 10 are presented as examples, and it will be apparent that other values of the voltages may be used in other embodiments. Additionally, while the memory device 300 is shown in FIG. 11 with 4 separator wordlines 306*a-d*, other embodiments may include a different number of separator wordlines. The bias voltages applied to the separator wordlines and/or other wordlines during the read operation or program verify operation may be determined, at least in part, by the number of separator wordlines included in the memory device. In various embodiments, the voltages may be applied to the memory device 300 by the control circuit (e.g., the control circuit 116 in cooperation with the voltage generator 107 of FIG. 1).

The read operation may be used to read data from memory cells (e.g., a page of memory cells) associated with a selected wordline (e.g., wordline 304*b* as illustrated in FIG. 10). The program verify operation may be used, for example, to verify that the program operation described with respect to FIG. 10 was successful. The values of the voltages shown in FIG. 10 are presented as examples, and it will be apparent that other values of the voltages may be used in other embodiments. In various embodiments, the voltages may be applied to the memory device 300 by the control circuit (e.g., the control circuit 116 in cooperation with the voltage generator 107 of FIG. 1).

As shown in FIG. 11, as part of the read operation and/or the program verify operation, the wordline 304*b*, which is associated with the memory cells of which data is to be read and/or programming is to be verified, may receive a bias voltage of about 1V. The wordlines 302*a-f* of the first set of wordlines 302, the wordlines 304*a* and 304*c-f* of the second set of wordlines 304, and the separator wordlines 306*a-f* may receive a bias voltage of about 8V. The SGS line 312 may receive a voltage of about 5V, and the source line 310 may receive a voltage of about 0V. The SGD line 316 may receive a voltage of about 0V, and the SGD line 320 may receive a voltage of about 5V. The bitlines 314 and 318 may receive voltages of about 0.5V.

Accordingly, the strings 308*c* and 308*d*, which are coupled with the SGD line 320, may be selected for read, while the strings 308*a* and 308*b*, which are coupled with the SGD line 316, are deselected for read. The wordline bias voltages cause the memory cells of strings 308*c* and 308*d* associated with wordline 304*b* to be read.

In various embodiments, a wear leveling scheme may be used by the memory device described herein (e.g., employed by the control circuit) to distribute cycling stress substantially evenly among memory blocks that are associated with a same string (e.g., the first and second memory blocks). Program-erase cycles in the first memory block, including programming data to the first memory block and subsequently erasing the data in the first memory block, may cause disturb stress in the second memory block. Repeated disturb stress in the second memory block may cause data that is stored in the memory cells of the second memory block to be lost or corrupted.

In various embodiments, the control circuit may ensure that program-erase cycling is not performed for the first memory block more than a predetermined number of times while the same data is stored in the second memory block. For example, the control circuit may perform program-erase cycles on the first memory block up to a predetermined number while the same data is stored in the second memory block (e.g., without an intervening erase operation in the second memory block). If the predetermined number is reached while the same data is stored in the second memory block, then the control circuit will not perform further program-erase cycles in the first memory block until the data in the second memory block is erased by an erase operation. The control circuit may follow a similar wear leveling scheme to prevent more than the predetermined number of program-erase cycles from being performed on the second memory block while the same data is stored in the first memory block.

The predetermined number used for the wear leveling scheme may be any suitable number of program-erase cycles, such as about 5 to about 50 program-erase cycles, for example about 10 program-erase cycles.

The wear leveling scheme for memory blocks associated with the same string may be used in addition to a global wear leveling scheme that is applied across all memory blocks of the memory array. For the global wear leveling scheme, the control circuit may ensure that a difference between the number of program-erase cycles for all memory blocks of the memory array are within a predetermined threshold of one another. In some embodiments, the predetermined threshold may be a percentage of program-erase cycles, such as 10%. The percentage threshold may only be applied after an initial number of program-erase cycles are performed to facilitate application of the percentage threshold.

The memory devices and methods described herein may be implemented into a system using any suitable hardware and/or software to configure as desired.

Figure 12:
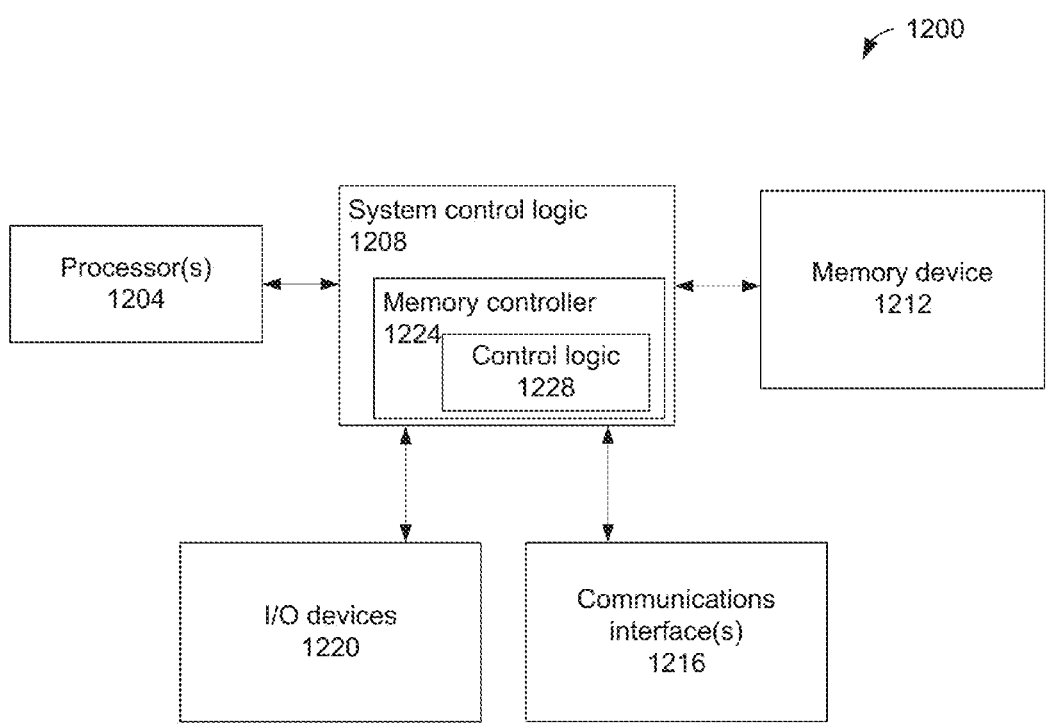
FIG. 12 schematically illustrates an example computing device that includes a memory device as described herein, in accordance with some embodiments.

FIG. 12 schematically illustrates an example computing device 1200 including a memory array having current leakage reduction techniques of the present disclosure, in accordance with some embodiments. The computing device 1200 may include system control logic 1208 coupled to one or more processor(s) 1204; a memory device 1212 having a memory array; one or more communications interface(s) 1216; and input/output (I/O) devices 1220.

The memory device 1212 may be a non-volatile computer storage chip that may include the memory device 100, 200, 300, and/or 400 with multiple memory blocks per string of memory cells, as described herein. In addition to the memory array, the memory device 1212 may include a package, having the memory device 100, 200, 300, and/or 400 disposed therein, driver circuitry (e.g., drivers), input/output connections to electrically couple the memory device 1212 with other components of the computing device 1200, etc. The memory device 1212 may be configured to be removably or permanently coupled with the computing device 1200.

Communications interface(s) 1216 may provide an interface for computing device 1200 to communicate over one or more network(s) and/or with any other suitable device. Communications interface(s) 1216 may include any suitable hardware and/or firmware. Communications interface(s) 1216 for one embodiment may include, for example, a network adapter, a wireless network adapter, a telephone modem, and/or a wireless modem. For wireless communications, communications interface(s) 1216 for one embodiment may use one or more antennas to communicatively couple the computing device 1200 with a wireless network.

For one embodiment, at least one of the processor(s) 1204 may be packaged together with logic for one or more controller(s) of system control logic 1208. For one embodiment, at least one of the processor(s) 1204 may be packaged together with logic for one or more controllers of system control logic 1208 to form a System in Package (SiP). For one embodiment, at least one of the processor(s) 1204 may be integrated on the same die with logic for one or more controller(s) of system control logic 1208. For one embodiment, at least one of the processor(s) 1204 may be integrated on the same die with logic for one or more controller(s) of system control logic 1208 to form a System on Chip (SoC).

System control logic 1208 for one embodiment may include any suitable interface controllers to provide for any suitable interface to at least one of the processor(s) 1204 and/or to any suitable device or component in communication with system control logic 1208. The system control logic 1208 may move data into and/or out of the various components of the computing device 1200.

System control logic 1208 for one embodiment may include a memory controller 1224 to provide an interface to the memory device 1212 to control various memory access operations. The memory controller 1224 may include control logic 1228 that may be specifically configured to control access of the memory device 1212.

In various embodiments, the I/O devices 1220 may include user interfaces designed to enable user interaction with the computing device 1200, peripheral component interfaces designed to enable peripheral component interaction with the computing device 1200, and/or sensors designed to determine environmental conditions and/or location information related to the computing device 1200. In various embodiments, the user interfaces could include, but are not limited to, a display, e.g., a liquid crystal display, a touch screen display, etc., a speaker, a microphone, one or more digital cameras to capture pictures and/or video, a flashlight (e.g., a light emitting diode flash), and a keyboard. In various embodiments, the peripheral component interfaces may include, but are not limited to, a non-volatile memory port, an audio jack, and a power supply interface. In various embodiments, the sensors may include, but are not limited to, a gyro sensor, an accelerometer, a proximity sensor, an ambient light sensor, and a positioning unit. The positioning unit may additionally/alternatively be part of, or interact with, the communication interface(s) 1216 to communicate with components of a positioning network, e.g., a global positioning system (GPS) satellite.

In various embodiments, the computing device 1200 may be a mobile computing device such as, but not limited to, a laptop computing device, a tablet computing device, a netbook, a smartphone, etc.; a desktop computing device; a workstation; a server; etc. The computing device 1200 may have more or less components, and/or different architectures. In further implementations, the computing device 1200 may be any other electronic device that processes data.

Some non-limiting Examples of various embodiments are presented below.

Example 1 is a memory apparatus comprising: a three-dimensional (3D) memory array having a plurality of strings of memory cells including a first string of memory cells; and a plurality of wordlines coupled with the plurality of strings, wherein individual wordlines are coupled to respective memory cells of the first string. The plurality of wordlines of the memory apparatus of Example 1 include: a first set of wordlines that correspond to a first set of memory cells in the first string; a second set of wordlines that correspond to a second set of memory cells in the first string, wherein a block erase operation uses the second set of wordlines to block erase the second set of memory cells without erasing the first set of memory cells; and a plurality of separator wordlines disposed between the first and second sets of wordlines.

Example 2 is the apparatus of Example 1, wherein the plurality of separator wordlines are coupled to dummy memory cells of the plurality of strings of memory cells, wherein the dummy memory cells are not used to store data.

Example 3 is the apparatus of Example 1, wherein the memory cells are NAND flash memory cells, and wherein the memory cells of the first string share a common channel region.

Example 4 is the apparatus of Example 1, further comprising control circuitry coupled to the 3D memory array, the control circuitry to provide different bias voltages to different separator wordlines of the plurality of separator wordlines during the block erase operation. The different bias voltages may increase from a first separator wordline adjacent the second set of wordlines to a second separator wordline adjacent the first set of wordlines Example 5 is the apparatus of Example 4, wherein the plurality of separator wordlines includes two or four wordlines.

Example 6 is the apparatus of Example 4, wherein, during the block erase operation, the control circuitry is to supply wordlines of the second set of wordlines with an erase select voltage that is less than the bias voltages, and wordlines of the first set of wordlines with an erase deselect voltage that is greater than the bias voltages.

Example 7 is the apparatus of Example 4, wherein the control circuitry is further to, during an erase verify operation, supply wordlines of the second set of wordlines with an erase verify voltage and wordlines of the first set of worlines with a pass-gate voltage that is less than the erase deselect voltage.

Example 8 is the apparatus of any one of Examples 1 to 7, further comprising control circuitry coupled to the 3D memory array, the control circuitry to: select the first set of memory cells for programming; determine whether memory cells of the second set of memory cells are programmed; and determine a wordline biasing scheme for programming the first set of memory cells based on the determination whether memory cells of the second set of memory cells are programmed.

Example 9 is the apparatus of Example 8, wherein, to determine whether memory cells of the second set of memory cells are programmed, the control circuitry is to determine a status of a flag for one or more wordlines of the second set of wordlines.

Example 10 is the apparatus of any one of Examples 1 to 7, further comprising control circuitry coupled to the 3D memory array, the control circuitry to: determine whether memory cells of the second set of memory cells are programmed; and determine a wordline biasing scheme for reading data from the first set of memory cells based on the determination whether memory cells of the second set of memory cells are programmed.

Example 11 is the apparatus of any one of Examples 1 to 8, further comprising control circuitry coupled to the 3D memory array, the control circuitry to prevent a number of program-erase cycles on the first set of memory cells from exceeding a pre-defined number of program-erase cycles while a same data is stored in the second set of memory cells.

Example 12 is the apparatus of any one of Examples 1 to 8, wherein the first set of memory cells are included in a first block and the second set of memory cells are included in a second block, wherein the first block further includes memory cells of one or more other strings of the plurality of strings, and wherein the second block further includes memory cells of the one or more other strings.

Example 13 is the apparatus of any one of Examples 1 to 8, further comprising: a processor; a display coupled to the processor; and a network interface coupled to the processor.

Example 14 is a method for operating a memory, the method comprising: providing, by a control circuit as part of a block erase operation, the control circuit coupled with a three-dimensional (3D) memory array having a plurality of strings of memory cells including a first string, a first bias voltage to a first separator wordline disposed between a first set of wordlines that correspond to a first set of memory cells in the first string and a second set of wordlines that correspond to a second set of memory cells in the first string, wherein the block erase operation uses the second set of wordlines to block erase the second set of memory cells without erasing the first set of memory cells; and providing, by the control circuit as part of the block erase operation, a second bias voltage to a second separator wordline that is disposed adjacent to the first separator wordline between the first and second sets of wordlines, wherein the second bias voltage is different from the first bias voltage.

Example 15 is the method of Example 14, wherein the second bias voltage is less than the first bias voltage, and wherein the second separator wordline is disposed between the first separator wordline and the second set of wordlines.

Example 16 is the method of Example 14, further comprising: providing, by the control circuit as part of the block erase operation, an erase select voltage to wordlines of the second set of wordlines, wherein the erase select voltage is less than the first and second bias voltages; and providing, by the control circuit as part of the block erase operation, an erase deselect voltage to wordlines of the first set of wordlines, wherein the erase deselect voltage is higher than the first and second bias voltages.

Example 17 is the method of any one of Examples 14 to 16, further comprising: determining whether memory cells of the second set of memory cells are programmed; and determining a wordline biasing scheme for programming the first set of memory cells based on the determination whether memory cells of the second set of memory cells are programmed.

Example 18 is a computing system comprising: a memory that includes: a memory array having a plurality of strings of memory cells including a first string of memory cells, wherein memory cells of individual strings share a common channel region, and wherein the first string of memory cells includes a first set of memory cells that are included in a first block of memory cells and a second set of memory cells that are included in a second block of memory cells; and a control circuit coupled with the memory array. The control circuit of Example 18 is to: receive data from the processor to be stored in the memory array; determine whether one or more memory cells of the second block are programmed; determine a wordline biasing scheme based on the determination whether one or more memory cells of the second block are programmed; and program the data to memory cells of the first block using the determined wordline biasing scheme.

Example 19 is the system of Example 18, wherein, to determine whether the one or more memory cells of the second block are programmed, the control circuit is to check a flag associated with the second block.

Example 20 is the system of Example 18, wherein the memory further includes a plurality of wordlines coupled with the plurality of strings, wherein the plurality of wordlines include a first set of wordlines that correspond to the first block of memory cells and a second set of wordlines that correspond to the second block of memory cells, and wherein, to program the data to memory cells of the first block using the determined wordline biasing scheme, the control circuit is to apply a program select voltage to a selected wordline of the first set of wordlines and bias voltages to respective unselected wordlines of the first set of wordlines, wherein values of the bias voltages are based on the determined wordline biasing scheme.

Example 21 is the system of Example 20, wherein, to determine whether the one or more memory cells of the second block are programmed, the control circuit is to check a flag associated with a pre-determined wordline of the second set of wordlines.

Example 22 is the system of Example 20, wherein, to determine whether the one or more memory cells of the second block are programmed, the control circuit is to check flags associated with a plurality of wordlines of the second set of wordlines.

Example 23 is the system of Example 20, wherein the plurality of wordlines further include a plurality of separator wordlines disposed between the first and second sets of wordlines, wherein the control circuit is to provide, during a block erase operation to erase the second block of memory cells without erasing the first block of memory cells, different bias voltages to different separator wordlines of the plurality of separator wordlines.

Example 24 is the system of Example 18, wherein the memory array is a three-dimensional (3D) NAND flash memory array.

Example 25 is the system of any one of Examples 18 to 24, further comprising: a processor; a display coupled to the processor; and a network interface coupled to the processor.

Example 26 is one or more non-transitory media having instructions, stored thereon, that when executed by one or more processors of a device, cause the device to: provide, as part of a block erase operation on a three-dimensional (3D) memory array having a plurality of strings of memory cells including a first string, a first bias voltage to a first separator wordline disposed between a first set of wordlines that correspond to a first set of memory cells in the first string and a second set of wordlines that correspond to a second set of memory cells in the first string, wherein the block erase operation uses the second set of wordlines to block erase the second set of memory cells without erasing the first set of memory cells; and provide, as part of the block erase operation, a second bias voltage to a second separator wordline that is disposed adjacent to the first separator wordline between the first and second sets of wordlines, wherein the second bias voltage is different from the first bias voltage.

Example 27 is the one or more media of Example 26, wherein the second bias voltage is less than the first bias voltage, and wherein the second separator wordline is disposed between the first separator wordline and the second set of wordlines.

Example 28 is the one or more media of Example 26, wherein the instructions, when executed, further cause the device to: provide, as part of the block erase operation, an erase select voltage to wordlines of the second set of wordlines, wherein the erase select voltage is less than the first and second bias voltages; and provide, as part of the block erase operation, an erase deselect voltage to wordlines of the first set of wordlines, wherein the erase deselect voltage is higher than the first and second bias voltages.

Example 29 is the one or more media of any one of Examples 26 to 28, wherein the instructions, when executed, further cause the device to: determine whether memory cells of the second set of memory cells are programmed; and determine a wordline biasing scheme for programming the first set of memory cells based on the determination whether memory cells of the second set of memory cells are programmed.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus comprising:
   a three-dimensional (3D) memory array comprising a plurality of strings of memory cells including a first string of memory cells;
   a plurality of wordlines coupled with the plurality of strings, wherein individual wordlines are coupled to respective memory cells of the first string, and wherein the plurality of wordlines include:
      a first set of wordlines that correspond to a first set of memory cells in the first string;
      a second set of wordlines that correspond to a second set of memory cells in the first string, wherein a block erase operation is to use the second set of wordlines to block erase the second set of memory cells without erasing the first set of memory cells; and
      a plurality of separator wordlines disposed between the first and second sets of wordlines; and
   control circuitry coupled to the plurality of wordlines, the control circuitry to:
      provide respective bias voltages to respective wordlines of the plurality of separator wordlines during the block erase operation;

provide wordlines of the second set of wordlines with an erase select voltage that is less than the bias voltages provided to the separator wordlines; and provide wordlines of the first set of wordlines with an erase deselect voltage that is greater than the bias voltages provided to the separator wordlines.

2. The apparatus of claim 1, wherein the plurality of separator wordlines are coupled to dummy memory cells of the plurality of strings of memory cells, wherein the dummy memory cells are not used to store data.

3. The apparatus of claim 1, wherein the memory cells comprise NAND flash memory cells, and wherein the memory cells of the first string share a common channel region.

4. The apparatus of claim 1, wherein the bias voltages provided to the respective separator wordlines are different from one another, and wherein the bias voltages provided to the respective separator wordlines increase from a first separator wordline adjacent the second set of wordlines to a second separator wordline adjacent the first set of wordlines.

5. The apparatus of claim 4, wherein the plurality of separator wordlines includes two or four wordlines.

6. The apparatus of claim 1, wherein the control circuitry is further to, during an erase verify operation, supply wordlines of the second set of wordlines with an erase verify voltage and wordlines of the first set of wordlines with a pass-gate voltage that is less than the erase deselect voltage.

7. The apparatus of claim 1, wherein the control circuitry is further to:
select the first set of memory cells for programming;
determine whether memory cells of the second set of memory cells are programmed; and
determine a wordline biasing scheme for programming the first set of memory cells based on the determination whether memory cells of the second set of memory cells are programmed.

8. The apparatus of claim 7, wherein, to determine whether memory cells of the second set of memory cells are programmed, the control circuitry is to determine a status of a flag for one or more wordlines of the second set of wordlines.

9. The apparatus of claim 1, wherein the control circuitry is further to:
determine whether memory cells of the second set of memory cells are programmed; and
determine a wordline biasing scheme for reading data from the first set of memory cells based on the determination whether memory cells of the second set of memory cells are programmed.

10. The apparatus of claim 1, wherein the control circuitry is further to prevent a number of program-erase cycles on the first set of memory cells from exceeding a pre-defined number of program-erase cycles while a same data is stored in the second set of memory cells.

11. The apparatus of claim 1, wherein the first set of memory cells are included in a first memory block and the second set of memory cells are included in a second memory block, wherein the first memory block further includes memory cells of one or more other strings of the plurality of strings, and wherein the second memory block further includes memory cells of the one or more other strings.

12. The apparatus of claim 1, further comprising:
a processor coupled to the memory;
a display coupled to the processor; and
a network interface coupled to the processor.

13. A method comprising:
providing, by a control circuit as part of a block erase operation, the control circuit coupled with a three-dimensional (3D) memory array comprising a plurality of strings of memory cells including a first string, a first bias voltage to a first separator wordline disposed between a first set of wordlines that correspond to a first set of memory cells in the first string and a second set of wordlines that correspond to a second set of memory cells in the first string, wherein the block erase operation uses the second set of wordlines to block erase the second set of memory cells without erasing the first set of memory cells;
providing, by the control circuit as part of the block erase operation, a second bias voltage to a second separator wordline that is disposed adjacent to the first separator wordline between the first and second sets of wordlines, wherein the second bias voltage is different from the first bias voltage;
providing, by the control circuit as part of the block erase operation, an erase select voltage to wordlines of the second set of wordlines, wherein the erase select voltage is less than the first and second bias voltages; and
providing, by the control circuit as part of the block erase operation, an erase deselect voltage to wordlines of the first set of wordlines, wherein the erase deselect voltage is higher than the first and second bias voltages.

14. The method of claim 13, wherein the second bias voltage is less than the first bias voltage, and wherein the second separator wordline is disposed between the first separator wordline and the second set of wordlines.

15. The method of claim 13, further comprising:
determining whether memory cells of the second set of memory cells are programmed; and
determining a wordline biasing scheme for programming the first set of memory cells based on the determination whether memory cells of the second set of memory cells are programmed.

* * * * *